United States Patent [19]

Emori et al.

[11] Patent Number: 5,330,684

[45] Date of Patent: Jul. 19, 1994

[54] ANISOTROPIC CONDUCTIVE ADHESIVE FILM

[75] Inventors: Kenji Emori; Yoshihiko Tasaka, both of Sagamihara, Japan

[73] Assignee: Minnesota Mining and Manufacturing Company, St. Paul, Minn.

[21] Appl. No.: 970,806

[22] Filed: Nov. 3, 1992

Related U.S. Application Data

[63] Continuation-in-part of Ser. No. 729,082, Jul. 12, 1991, abandoned.

[51] Int. Cl.$^5$ .......................... H01B 1/00; H01B 1/20; H01B 1/22
[52] U.S. Cl. .................................... 252/512; 252/514; 252/518; 525/403; 525/438
[58] Field of Search ............... 252/502, 511, 512, 514, 252/518; 525/403, 438; 156/DIG. 68, DIG. 101

[56] References Cited

U.S. PATENT DOCUMENTS

| | | | |
|---|---|---|---|
| 3,562,214 | 2/1971 | Kubens et al. | 260/47 |
| 4,552,690 | 11/1985 | Ikeguchi et al. | 252/512 |
| 4,740,343 | 4/1988 | Gaku et al. | 264/225 |
| 4,780,507 | 10/1988 | Gaku et al. | 525/523 |
| 5,143,785 | 9/1992 | Pujol et al. | 252/512 |

FOREIGN PATENT DOCUMENTS

| | | |
|---|---|---|
| 242025 | 10/1987 | European Pat. Off. . |
| 266986 | 5/1988 | European Pat. Off. . |
| 181379 | 8/1987 | Japan . |
| 86781 | 4/1988 | Japan . |

*Primary Examiner*—Paul Lieberman
*Assistant Examiner*—M. Kopec
*Attorney, Agent, or Firm*—Gary L. Griswold; Walter N. Kirn; Darla P. Neaveill

[57] ABSTRACT

A composition for forming a moisture resistant, anisotropic conductive film having a rapid curing speed, high heat resistance, high humidity resistance, long shelf life and excellent repairability comprising an adhesive composition containing about 100 parts cyanate ester, from about 0.01 part to 10 parts of a curing catalyst, from about 10 parts to about 300 parts of a film-formable thermoplastic resin, and from about 10 to about 500 parts of an epoxy resin, and from about 0.1 part to about 20 parts conductive particles per 100 parts total adhesive composition.

17 Claims, No Drawings

ANISOTROPIC CONDUCTIVE ADHESIVE FILM

This application is a continuation-in-part of application Ser. No. 07/729,082 filed Jul. 12, 1991, now abandoned.

BACKGROUND OF THE INVENTION

Field of the Invention

The present invention relates to a moisture resistant anisotropic adhesive composition, and Z-axis adhesive film formed therefrom.

Description of the Related Art

Recently, with the development of high-density mounting and improved techniques in making electrical components, electrical circuits have become smaller and have higher connection densities. For bonding these precise and fine-pitch circuits, conductive adhesives have been frequently used. Ideally, a conductive adhesive is provided as a self-supporting film. Liquid systems, such as prior art epoxies will migrate due to capillary action and may touch or contaminate a critical area of the circuit. Anisotropic conductive films, also known as Z-axis films have been proposed. One advantage is that ZAFs provide pressure-engaged connections. Therefore, excellent resistance stability, high peel adhesion, and high insulative resistivity are needed for the ZAF. Also, to improve the productivity, a very short bonding time and low bonding temperature such as 180° C. for 20 seconds are required. Moreover, with the progress of circuits, the alignment has become more difficult and the number of connection failures has also increased. So repairability is essential; repairability is defined as the ease by which the substrate is cleaned with normal solvents.

As disclosed in JPP1987-181379 and JPP1988-86781 (A), styrene-butadiene-styrene block copolymers (SBS) and styrene-ethylene-butylene-styrene clock copolymers (SEBS) are used. These thermoplastic resins have good repairability, but poor heat and humidity resistance. Further, the resins are high molecular weight, and have a high melt viscosity. The resistance stability tends to become worse and there is a limitation in that comparatively large size conductive particles are required.

Epoxy thermoset adhesives have also been proposed; however, they are not repairable. Further, the curing speed is long, the shelf life is short, and the mixing of resin and hardeners are sometimes ineffective.

Z-axis films using cyanate films exhibit fast curing, good heat resistance, excellent resistance stability and repairability as described in U.S. Pat. No. 5,143,785. However, cyanate esters may also easily absorb moisture, and the peel adhesion may decrease after humidity aging.

Combinations of cyanate esters and epoxy resins are disclosed in U.S. Pat. No. 3,562,214. However, the addition of epoxy resins to cyanate esters remarkably decreases the heat resistance temperature. Also film-formability is significantly impaired.

It has now been discovered that certain combination of an epoxy, a cyanate ester, and a film-formable thermoplastic resin provide a z-axis film with a rapid curing speed, good heat resistance, good humidity resistance, long shelf life and excellent repairability.

SUMMARY OF THE INVENTION

The present invention provides a composition for the formation of an anisotropically conductive adhesive film which provides good adhesive properties, excellent repairability, excellent humidity resistance, and good heat resistance.

Moisture resistant, anisotropically conductive adhesives of the invention comprise:
   a) about 100 parts of cyanate ester resin, including one or more cyanate ester compounds
   b) from about 10 to about 300 parts of a film formable thermoplastic resin,
   c) from about 10 to about 500 parts of an epoxy resin,
   d) from about 0.01 to about 10 parts of a organometallic catalyst, and
   e) from about 0.1 to about 20 parts conductive particles per 100 parts total weight of said adhesive,
wherein said adhesive being curable in 60 seconds or less at 180° C.

The present invention further provides an anisotropic film formed from the composition.

As used herein, the terms "Z-axis film" and "ZAF" are used interchangeably to mean an adhesive film having electrical conductivity in the direction of the "Z" axis.

DETAILED DESCRIPTION OF THE INVENTION

Compositions of the invention contain cyanate esters as major components. These resins have good heat and humidity resistance and are capable of rapid curing with certain self-crosslinking catalysts.

Cyanate ester resins comprise cyanate ester compounds (monomers and oligomers) each having two or more —OCN functional groups, and typically having a cyanate equivalent weight of from about 50 to about 500, preferably from about 50 to about 250. The molecular weight of the monomers and oligomers are typically from about 150 to about 2000. If the molecular weight is too low, the cyanate ester has a crystalline structure which is difficult to dissolve in solvent. If the molecular weight is too high, the compatibility of the cyanate ester with other resins is poor.

Preferred compositions of the invention include one or more cyanate esters according to Formulas I, II, III or IV. Formula I is represented by $$Q(OCN)_p \qquad \text{Formula I}$$

wherein p can be from 2 to 7, and wherein Q comprises at least one of the following categories: (1) a mono-, di-, tri-, or tetra-substituted aromatic hydrocarbon containing from about 5 to about 30 carbon atoms, (2) a 1 to 5 aliphatic or polycyclic aliphatic mono-, di-, tri-or tetra-substituted hydrocarbon containing from about 7 to about 20 carbon atoms. Optionally, either category may contain from about 1 to about 10 heteroatoms selected from the group consisting of non-peroxidic oxygen, sulfur, non-phosphino phosphorous, non-amino nitrogen, halogen, and silicon. Formula II is represented by

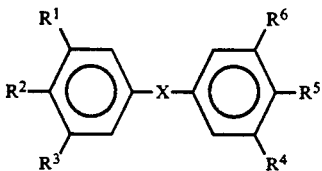

Formula II where X is a single bond, a lower alkylene group having from 1 to 4 carbons, —S—, or the $SO_2$ group; and where $R^1$, $R^2$, $R^3$, $R^4$, $R^5$, and $R^6$ are independently hydrogen, an alkyl group having from one to three carbon atoms, or the cyanate ester group (—OC≡N), with the proviso that at least two of $R^1$, $R^2$, $R^3$, $R^4$, $R^5$, and $R^6$ are cyanate ester groups. In preferred compounds, each of the R groups is either —H, methyl or the cyanate ester group.

Formula III is represented by

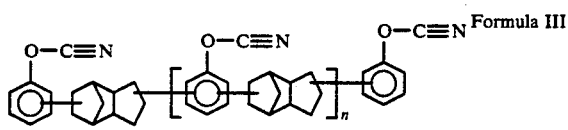

Formula III where n is from 0 to about 5.

Formula IV is represented by

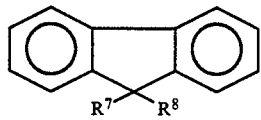

Formula IV wherein $R^7$ and $R^8$ are independently

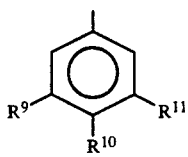

wherein $R^9$, $R^{10}$, $R^{11}$ are independently —H, a lower alkyl group having from about 1 to about 5 carbon atoms, or the cyanate ester group, preferably hydrogen, methyl or the cyanate ester group, with the proviso that $R^7$, and $R^8$ combined include at least two cyanate ester groups.

Useful cyanate ester compounds include, but are not limited to the following:
1,3- and 1,4-dicyanatobenzene;
2-tert-butyl-1,4-dicyanatobenzene;
2,4-dimethyl-1,3-dicyanatobenzene;
2,5-di-tert-butyl-1,4-dicyanatobenzene;
tetramethyl-1,4-dicyanatobenzene;
4-chloro-1,3-dicyanatobenzene;
1,3,5-tricyanatobenzene;
2,2'- and 4,4'-dicyanatobiphenyl;
3,3'5,5'-tetramethyl-4,4'-dicyanatobiphenyl;
1,3-, 1,4-, 1,5-, 1,6-, 1,8-, 2,6-, and 2,7-dicyanatonaphthalene;
1,3,6-tricyanatonaphthalene;
bis(4-cyanatophenyl)methane;
bis(3-chloro-4-cyanatophenyl)methane;
bis(3,5-dimethyl-4-cyanatophenyl)methane;
1,1-bis(4-cyanatophenyl)ethane;
2,2-bis(4-cyanatophenyl)propane;
2,2-bis(3,3-dibromo-4-cyanatophenyl)propane;
2,2-bis(4-cyanatophenyl)-1,1,1,3,3,3-hexafluoropropane;
bis(4-cyanatophenyl)ester;
bis(4-cyanatophenoxy)benzene;
bis(4-cyanatophenyl)ketone;
bis(4-cyanatophenyl)thioether;
bis(4-cyanatophenyl)sulfone;
tris(4-cyanatophenyl)phosphate, and
tris(4-cyanatophenyl)phosphate.

Also useful are cyanic acid esters derived from phenolic resins, e.g., as disclosed in U.S. Pat. No. 3,962,184, cyanated novolac resins derived from novolac, e.g., as disclosed in U.S. Pat. No. 4,022,755, cyanated bisphenol-type polycarbonate oligomers derived from bisphenol-type polycarbonate oligomers, as disclosed in U.S. Pat. No. 4,026,913, cyano-terminated polyarylene ethers as disclosed in U.S. Pat. No. 3,595,900, and dicyanate esters free of ortho hydrogen atoms as disclosed in U.S. Pat. No. 4,740,584, mixtures of di- and tricyanates as disclosed in U.S. Pat. No. 4,709,008, polyaromatic cyanates containing polycyclic aliphatic groups as disclosed in U.S. Pat. No. 4,528,366, e.g., QUARTEX TM 7187, available from Dow Chemical, fluorocarbon cyanates as disclosed in U.S. Pat. No. 3,733,349, and cyanates disclosed in U.S. Pat. Nos. 4,195,132, and 4,116,946, all of the foregoing patents being incorporated by reference.

Polycyanate compounds obtained by reacting a phenol-formaldehyde precondensate with a halogenated cyanide are also useful.

Examples of preferred cyanate ester compositions include low molecular weight oligomers, e.g., from about 250 to about 1200, of bisphenol-A dicyanates such as AroCy TM "BC-30 Cyanate Ester Semisolid Resin"; low molecular weight oligomers of tetra o-methyl bisphenol F dicyanates, such as "AroCy TM M-30 Cyanate Ester Semisolid Resin"; low molecular weight oligomers of thiodiphenol dicyanates, such as AroCy TM "T-30", all of which are commercially available from Hi-Tek Polymers, Jeffersontown, Ky.

Known curing catalysts are useful in compositions of the invention. Organometallic compounds which may be salts or beutral compounds are suitable candidates. An organometallic compound is defined as a species which has at least one carbon covalently bonded to a transition metal atom. Organometallic catalysts may be activated by either heat or light. They are easily dissolved and dispersed in the adhesive formulation.

Catalysts for the reaction of the cyanate ester include organometallic compounds containing a cyclopentadienyl group, $C_5H_5$, and suitable derivatives, such as cyclopentadienyl iron dicarbonyl dimer, $[C_5H_5Fe(CO)_2]_2$, pentamethylcyclopentadienyl iron dicarbonyl dimer, $[C_5(CH_3)_5Fe(CO)_2]_2$, methylcyclopentadienyl manganesetricarbonyl, all available from Strem Chemical Company, Newburyport, Mass., and hexafluorophosphate salt of the cyclopentadientyl iron mesitylene cation, $C_5H_5$ (mesitylene)$Fe^+PF_6$, and trifluoromethanesulfonate salt of the cyclopentadienyl iron mesitylene cation, $C_5H_5$ (mesitylene)$Fe^+CF_3SO_3$, both of which may be prepared as described in U.S. Pat. No. 4,868,288, incorporated herein by reference.

Other organometallic compounds which are suitable catalysts for use in the present invention are disclosed in EPO Publication No. 364,073. Suitable sources of radiation for photoactivation of the catalysts include such conventional sources as mercury vapor discharge lamps, tungsten lamps, xenon lamps, fluorescent lamps, sunlamps, lasers, carbon arcs, and sunlight. Photoactivated catalysts are preferred as they increase shelf life.

Useful film-formable thermoplastics are those having good compatibility with cyanate ester and a group reactive to epoxy. Included in this class are polyvinylbutyral, polyvinylformyl, polyvinylacetal, polyamide, phenoxy, polysulfone, polycarbonate siloxane, polyvinyl, carboxylated SEBS, and the like. Preferred thermoplastics are those having molecular weights between about 3,000 and about 200,000. If the molecular weight is below about 3000, the resin has a poor film-forming ability; if the molecular weight is over 200,000, the thermoplastic and the cyanate ester will not mix adequately, and the curing time is significantly extended.

Suitable polysulfones include those having the general formula:

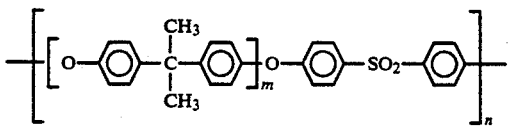

wherein m is 0 or 1, and n is 10 to 500, When m is 0, n is preferably from about 12 to about 50, and when m is 1, n is preferably from about 40 to about 70.

Examples of suitable polysulfones include "P1700-NT11", commercially available from Amoco Performance Products, Ridgefield, Conn.; and "Victrex PES 5003P", commercially available from ICI Advanced materials, Wilmington, Del., Suitable polyvinyl acetals are those having the general formula:

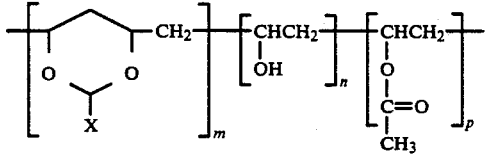

wherein X is —H or a $C_1$-$C_4$ alkyl group, and m is from about 80 to about 2400, n is from about 10 to about 2200, and p is from 0 to about 500. Preferably, m is greater than n, n is greater than p, m is less than 800, and each monomer is randomly distributed.

Suitable phenoxy resins have the following general formula:

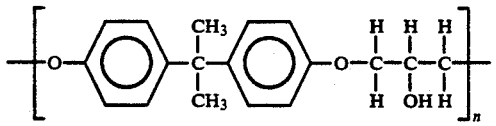

wherein n is 75 to 150.

Useful phenoxy resins include "UCAR" resins, available in three molecular weight grades ranging from 25,000 to 35,000, from Union Carbide Company, Danbury, Conn.

Examples of useful polyvinylacetals include polyvinylbutryals, such as Sekisui S-LEC BX-L.

Examples of useful polyamides include Unires 2636, commercially available from Union Camp, Jacksonville, Fla.

Examples of polyesters include Dynapol 206, commercially available from HULS America, Inc. One useful polycarbonatesiloxane is LR3320, from General Electric, Schenectady, N.Y. Examples of polyvinylics include polystyrene, polyacrylates, and polymethacrylates.

An epoxy resin is defined as a resin having more than one epoxy group. Preferably, conventional epoxy resins having from about 150 to about 400 epoxy equivalents may be used. Useful epoxy resins include, but are not limited to, cyclaliphatic epoxies such as derivatives of cyclohexene oxide, e.g., ERL 4221, available from Union Carbide; glycidyl ethers, e.g., EPON 828, available from Shell Chemical, and epoxy modified polymers or oligomers, e.g., Epikote ™ 152, available from Shell Chemical. The epoxy resin comprises from about 10 to about 500 parts by weight per 100 parts of cyanate ester. If the epoxy content is below 10 parts, the heat and humidity resistance is only slightly improved. If the content is over 500 parts by weight, there is unreacted epoxy resin left and initial peel adhesion decreases.

Known conductive materials can be chosen from such as metal particles, coagulated metal particles, solder particles, and conductive particles having a polymer core thin metal surface layer. Compositions of the invention contain from about 0.1 part to about 20 parts by weight of the conductive material to 100 parts by total adhesive weight. If the conductive material content is below 0.1 part, resistance stability decreases. If the content is above 20 parts, there is a high possibility of short circuit.

The invention can further comprise other thermosetting resins such as phenolic and silicone resins, epoxy hardeners, tackifiers, coupling agents, antioxidants, modifiers and additives without departing from the spirit of the invention.

All percents, parts and ratios herein are by weight unless specifically stated otherwise. The following examples are meant to be illustrative and do not limit the scope of the invention, which is defined solely by the claims.

EXAMPLES 1-3 AND C1

Four formulations containing 100 parts "B30", a partially trimerized cyanate ester of Bispheonl-A, available from Rhone Poulenc, 100 parts "BXL", polyvinyl butryal, available from Sekisui Chemical, 1 part iron dimer catalyst having the formula [CpFe(CO)$_2$]$_2$, 2 parts glyxidoxypropyl trimethoxysilane, and 0, 10, 20 and 30 parts respectively of Epikote ™ 152, glycidyl ether of a novaolak phoneol-formaldehyde resin, available from Shell Chemical, were knife coated onto silicone treater polyester release liner. The formulations were then oven dried to yield films having a thickness of 23 microns. The films were then used to heat bond commercial gold plated copper/polyimide flexible circuitry (0.2 mm pitch, 0.1 mm trace width, 35 μm conductor thickness) to indium-tin oxide (ITO) glass (30 ohm/sq arc resistivity) at 180° C. and 30 kg/cm$^2$ for 20 seconds. Adhesion of the samples was measured by a 90° Peel test before and after 168 hours humidity cycle aging (i.e., −20° C. for two hours to 70° C./90% relative humidity for two hours with a two hour ramp time). The results are shown in Table 1.

These examples demonstrate that cyanate ester adhesives may be made using epoxy resins. The initial peels may vary, and the formulation can be adjusted to provide the peel required. However, increasing the epoxy resin increases the peel retention.

TABLE 1

| EX | PARTS EPOXY | INITIAL PEEL (g/cm) | AGED PEEL (g/cm) | PEEL RETENTION (%) |
|---|---|---|---|---|
| C1 | 0 | 1750 | 380 | 22 |
| 1 | 10 | 1290 | 360 | 28 |
| 2 | 20 | 1020 | 330 | 32 |
| 3 | 30 | 1540 | 890 | 58 |

EXAMPLES 5–12

Formulations were prepared coated bonded and tested as described in Example 1 except that the humidity aging was carried out for 1000 hours. The results are shown in Table 2. As can be seen, epoxy is effective in maintaining the peel adhesion of cyanate adhesives during humidity cycling. High levels of epoxy were effectively used in cyanate ester adhesives without reduction of peel adhesion properties.

TABLE 2

| EX | B30[a] | QUATREX 1010[a,b] | IDC[a] | BXL[a] | BX1[a,c] | A187[a] | INITIAL PEEL (g/cm) | AGED PEEL (g/cm) | PEEL RETENTION (%) |
|---|---|---|---|---|---|---|---|---|---|
| 5 | 100 | 0 | 1 | 80 | 20 | 2 | 1600 | 600 | 38 |
| 6 | 100 | 25 | 1 | 80 | 20 | 2.3 | 1440 | 1380 | 96 |
| 7 | 100 | 50 | 1 | 80 | 20 | 2.5 | 1280 | 1310 | 102 |
| 8 | 100 | 75 | 1 | 80 | 20 | 2.8 | 1250 | 1370 | 110 |
| 9 | 100 | 100 | 1 | 80 | 20 | 3.0 | 1300 | 850 | 65 |
| 10 | 100 | 125 | 1 | 80 | 20 | 3.3 | 1250 | 660 | 53 |
| 11 | 100 | 150 | 1 | 80 | 20 | 3.5 | 1500 | 1020 | 68 |

[a]in parts
[b]glycidyl ether of bisphenol A, available from Dow Chemical
[c]polyvinyl butryal, available form Sekisui Chemical

EXAMPLES 12–15

These formulations contained 100 parts cyanate ester "BT2160RX", available from Mitsubishi Gas Chemical Company, 100 parts "BXL" polyvinyl butryal, available from Sekisui Chemical, 1 part iron dimer catalyst [CpFe(CO)$_2$]$_2$, 6 parts "A187" coupling agent, 11.5 parts Finepearl TM gold plated polymer particles having a 10 micrometer average diameter, available from Sumitomo Chemical, and 0, 12.5, 25, and 37.5 parts Quatrex TM 1010, were knife coated from methylethylketone onto silicone treated polyester release liner. The formulations were oven dried, yielding films of 23 microns. The films were used to heat-bond commercial tin plated copper/polyimide flexible circuitry (0.2 mm pitch, 0.1 mm trace width, 35 micrometer conductor thickness) to ITO glass (30 ohm/sq arc resistivity) at 180° C. and 30 kg/cm$^2$ for 10 seconds. 90° C. peel adhesion was measured before and after 15 hours of aging at 105° C., 100% relative humidity, and 1.2 atm of pressure. The results are shown in Table 3; as can be seen, addition of epoxy improves peel retention when the bonds are exposed to very harsh aging conditions. Epoxy also bonds quickly without sacrifice of peel retention, and epoxies are effective in the present of conductive particles.

TABLE 3

| EX | PARTS EPOXY | INITIAL PEEL (g/cm) | AGED PEEL (g/cm) | PEEL RETENTION (%) |
|---|---|---|---|---|
| 12 | 0 | 809 | 187 | 23 |
| 13 | 12.5 | 674 | 414 | 61 |
| 14 | 25 | 637 | 494 | 78 |
| 15 | 37.5 | 645 | 291 | 45 |

EXAMPLES 16 AND 16C

The formulations contained 100 parts "BT2160RX, 90 parts "BM1", 10 parts "BL1", 1 part iron dimer catalyst, 6 parts A187 coupling agent, 11.5 parts Bell Pearl TM nickel plated polymer particles, available from Kanebo, and 35 parts Epikote TM 152 for Example 16, and 0 parts for Examples 16C. The formulations were knife coated from methyl ethyl ketone onto silicone treated polyester release liner. The formulations were oven dried to yield 23 micrometer thick films. The films were used to heat-bond commercial gold plated copper/polyimide flexible circuitry (0.2 pitch, 0.1 mm trace width, 35 micrometer conductor thickness) to ITO glass (30 ohm/sq. art resistivity) at 180° C. and 30 kg/cm$^2$ for 20 seconds.

90° peel adhesion was measured before and after 15 hours of aging at 105° C., 100% relative humidity, and 1.2 atm of pressure. Example 16 had an initial peel of 1320 g/cm, and an aged peel of 1430 g/cm (108% peel retention). Example 16C had an initial peel of 750 g/cm and an aged peel of 600 g/cm (80% peel retention). As can be seen, epoxy in the adhesive formulation can lead to increased peel strength both before and after harsh aging conditions.

EXAMPLES 17 AND 17C

These two formulations contained 100 parts BT2160RX, 75 parts BM1, 25 parts BLS, 1 part iron dimer catalyst, 6 parts A187 coupling agent, 12.5 parts Bell Pearl TM nickel plated polymer particles and 35 parts Epiclon 830S, an epoxy resin available from Dai-Nippon Ink and Chemicals for Example 17, and 0 parts for Example 17C. 90° peel adhesion was measured as described for Example 16. Example 17 had an initial peel of 845 g/cm and an aged peel of 765 g/cm (90% peel retention). The formulation without epoxy had a higher initial peel 1320 g/cm, but an aged peel of 650 g/cm (49% peel retention).

EXAMPLE 18

This formulation contained 100 parts B10, an epoxy resin available from Rhone Poulenc, 100 parts BX1, 1 part iron dimer catalyst, 15 parts Finepearl TM gold plated polymer particles and 50 parts ERL 4221, a cycloaliphatic epoxy resin available from Union Carbide. These formulations were coated and bonded as described in Example 1. Resistance across the adhesive bonds were measured by a multimeter before and after 250 hours of aging at 85° C. and 85% relative humidity. The resistance before and after aging was less than 50 ohm for both bonded formulations which demonstrates that cyanate ester conductive adhesives incorporating epoxy resins are suitable for use in electronic applications. The example further shows that cyanate esters other than bisphenol A are useful.

What is claimed is:

1. A moisture resistant anisotropically electrically conductive adhesive comprising:
   a) about 100 parts of cyanate ester resin, including one or more cyanate ester compounds,
   b) from about 10 to about 300 parts of a film formable thermoplastic resin,
   c) from about 10 to about 500 parts of an epoxy resin,
   d) from about 0.01 to about 10 parts of an organometallic catalyst, wherein said catalyst contains at least one carbon atom covalently bonded to a transition metal atom, and
   e) from about 0.1 to about 20 parts conductive particles selected from the group consisting of metal particles, including coagulated metal particles, and metal-covered polymeric particles per 100 parts total weight of said adhesive,
said adhesive having been cured in 60 seconds or less at 180° C.

2. The moisture resistant, anisotropic adhesive of claim 1 wherein said film formable thermoplastic resin is selected from the group consisting of polyvinylbutyral, polyvinylformal, polyvinylacetal, polyamide, phenoxy, polysulfone, polyacrylate, glycidyl acrylate, styrene-butadiene-styrene block copolymers, carboxylic styrene-ethylene-butylene-styrene block copolymers, and epoxylic styrene-ethylene-butylene-styrene block copolymers.

3. The moisture resistant, anisotropically conductive adhesive of claim 1 wherein the film formable thermoplastic resin has a molecular weight of from about 3,000 to about 200,000.

4. The moisture resistant, anisotropic adhesive of claim 1 wherein said cyanate esters have cyanate equivalent weight of from about 50 to about 500.

5. The moisture resistant anisotropically conductive of claim 1 wherein said cyanate ester compounds have a molecular weight of from about 150 to about 2000.

6. The moisture resistant, anisotropically conductive adhesive of claim 1 wherein said cyanate ester resin includes one or more cyanate ester resin compositions having the following general formulas:

$$Q(OCN)_p \quad \text{Formula I}$$

wherein p can be from 2 to 7, and wherein Q comprises at least one of the following categories: (1) a mono-, di-, tri-, or tetra-substituted aromatic hydrocarbon containing from about 5 to about 30 carbon atoms, (2) a 1 to 5 aliphatic or polycyclic aliphatic mono-, di-, tri-or tetra-substituted hydrocarbon containing from about 7 to about 20 carbon atoms;

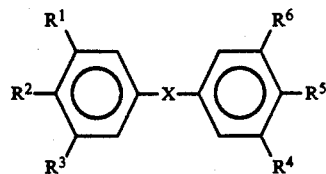
Formula II where X is a single bond, a lower alkylene group having from 1 to 4 carbons, —S—, or the $SO_2$ group; and where $R^1$, $R^2$, $R^3$, $R^4$, $R^5$, and $R^6$ are independently hydrogen, an alkyl group having from one to three carbon atoms, or the cyanate ester group (—OC≡N), with the proviso that at least two of $R^1$, $R^2$, $R^3$, $R^4$, $R^5$, and $R^6$ are cyanate ester groups. In preferred compounds, each of the R groups is either —H, methyl or the cyanate ester group.

Formula III is represented by

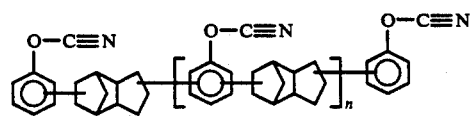

where n is from 0 to about 5,

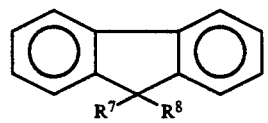
Formula IV wherein $R^7$ and $R^8$ are independently

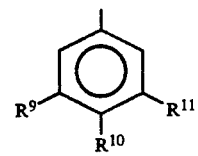

wherein $R^9$, $R^{10}$, $R^{11}$ are independently —H, a lower alkyl group having from about 1 to about 5 carbon atoms, or the cyanate ester group, preferably hydrogen, methyl or the cyanate ester group, with the proviso that $R^7$, and $R^8$ combined include at least two cyanate ester groups.

7. The moisture resistant anisotropically conductive adhesive of claim 6 wherein said cyanate ester compounds according to Formula I contain from 1 to 10 heteroatoms selected from the group consisting of non-periodic oxygen, sulfur, non-phosphino phosphorus, non-amino nitrogen, halogen and silicon.

8. The moisture resistant anisotropically conductive adhesive of claim 1 wherein the cyanate ester is selected from the group consisting of: 2,2-bis(4-cyanatophenyl)-propane, 2,2-bis(4-cyanatophenyl)propane, 2,2-bis(4-cyanatophenyl)propane, bis(3,5-dimethyl)(4-cyanatophenyl)methane, and cycloaliphatic cyanate ester.

9. The moisture resistant, anisotropically conductive adhesive of claim 1 wherein said epoxy resin has from about 150 to about 400 epoxy equivalents.

10. The moisture resistant, anisotropically conductive adhesive of claim 1 wherein said epoxy resin is selected from the group consisting of cycloaliphatic epoxies, glycidyl ethers, and epoxy modified polymers or oligomers, and mixtures thereof.

11. The moisture resistant, anisotropically conductive adhesive of claim 10 wherein said cycloaliphatic epoxies are derivatives of cyclohexene oxide.

12. The moisture resistant, anisotropically conductive adhesive of claim 10 wherein said epoxy resin contains at least on glycidyl ether of bisphenol A.

13. The moisture resistant, anisotropically conductive adhesive of claim 1 further including a silane coupling agent.

14. The moisture resistant, anisotropically conductive adhesive of claim 13 wherein said silane coupling agent is present at a level of from about 0.1 to about 5 percent by weight.

15. The moisture resistant, anisotropically conductive adhesive of claim 1 wherein said conductive particles are selected from the group consisting of metal particles, and conductive particles having a polymer core and a thin metal surface layer.

16. The moisture resistant, anisotropically conductive adhesive of claim 1 wherein said adhesive is attached to a release liner.

17. The moisture resistant, anisotropically conductive adhesive of claim 1 wherein said metal particles are selected from the group consisting of coagulated metal particles and solder particles.

* * * * *